United States Patent
Maehara et al.

(10) Patent No.: US 8,013,408 B2
(45) Date of Patent: Sep. 6, 2011

(54) NEGATIVE-RESISTANCE DEVICE WITH THE USE OF MAGNETO-RESISTIVE EFFECT

(75) Inventors: Hiroki Maehara, Mitaka (JP); Hitoshi Kubota, Tsukuba (JP); Akio Fukushima, Tsukuba (JP); Shinji Yuasa, Tsukuba (JP); Yoshishige Suzuki, Ikeda (JP); Yoshinori Nagamine, Fuchu (JP)

(73) Assignee: Canon Anelva Corporation, Kawasaki-shi (JP)

( * ) Notice: Subject to any disclaimer, the term of this patent is extended or adjusted under 35 U.S.C. 154(b) by 77 days.

(21) Appl. No.: 12/468,369

(22) Filed: May 19, 2009

(65) Prior Publication Data

US 2009/0261436 A1 Oct. 22, 2009

Related U.S. Application Data

(63) Continuation of application No. PCT/JP2007/069019, filed on Sep. 28, 2007.

(51) Int. Cl.
*H01L 29/82* (2006.01)
*G11C 11/02* (2006.01)

(52) U.S. Cl. . 257/421; 257/422; 257/423; 257/E29.323; 438/3; 365/157; 365/171; 360/324.2

(58) Field of Classification Search ............ 257/20, 257/414, 421–427, E29.323; 438/3; 365/157–158, 365/171–173; 360/324–326, 313

See application file for complete search history.

(56) References Cited

U.S. PATENT DOCUMENTS

2004/0207961 A1   10/2004   Ichimura et al. .......... 360/324.2

FOREIGN PATENT DOCUMENTS

| JP | S35-006326 | 9/1960 |
| JP | 2004-158750 | 6/2004 |

OTHER PUBLICATIONS

Kiselev et al., "Microwave Oscillations of a Nanomagnet Driven by a Spin-Polarized Current", Nature, vol. 425, pp. 380-383 (2003).
Maehara et al., "Spin Torque Diode and Negative Resistance Effect", The Magnetics Society of Japan, pp. 31-35 (2007) and English translation of relevant section.
Suzuki, "New Developments of Metal Spintronics—Tunnel Magnetoresistive Effect and Spin Torque Diode", ATI News, No. 4, pp. 2-6 (2006) and English translation of relevant section.
Tulapurkar et al., "Spin-Torque Diode Effect in Magnetic Tunnel Junctions", Nature, vol. 438, pp. 339-342 (2005).

*Primary Examiner* — Jami M Valentine
(74) *Attorney, Agent, or Firm* — Fitzpatrick, Cella, Harper & Scinto (57) ABSTRACT

A magneto-resistive device has a magnetic free layer (33), a magnetic pinned layer (31) having a magnetic moment larger than that of the magnetic free layer, and an intermediate layer (32) provided between the magnetic free layer and the magnetic pinned layer. The negative-resistance device is characterized in that the negative-resistance device shows negative resistance by making the magnetic free layer continually change the magnetization direction along with the increase of the voltage which is applied to a magneto-resistive device so that electrons flow into the negative-resistance device from a magnetic free layer side.

9 Claims, 9 Drawing Sheets

NEGATIVE-RESISTANCE DEVICE WITH THE USE OF MAGNETO-RESISTIVE EFFECT

CROSS-REFERENCES TO RELATED APPLICATIONS

This application is a continuation application of International Application No. PCT/JP2007/069019, filed on Sep. 28, 2007, the entire contents of which are incorporated by reference herein.

TECHNICAL FIELD

The present invention relates to a negative-resistance device with the use of a magneto-resistive effect.

BACKGROUND ART

A tunnel diode represented by an Esaki diode is known as a conventional negative-resistance device (for instance, in Patent Document 1). The negative resistance shown by the tunnel diode originates in a tunnel phenomenon, and in the case of the Esaki diode, for instance, the negative resistance is realized by enhancing impurity concentrations of P type and N type in a PN junction diode.

Figure 1:
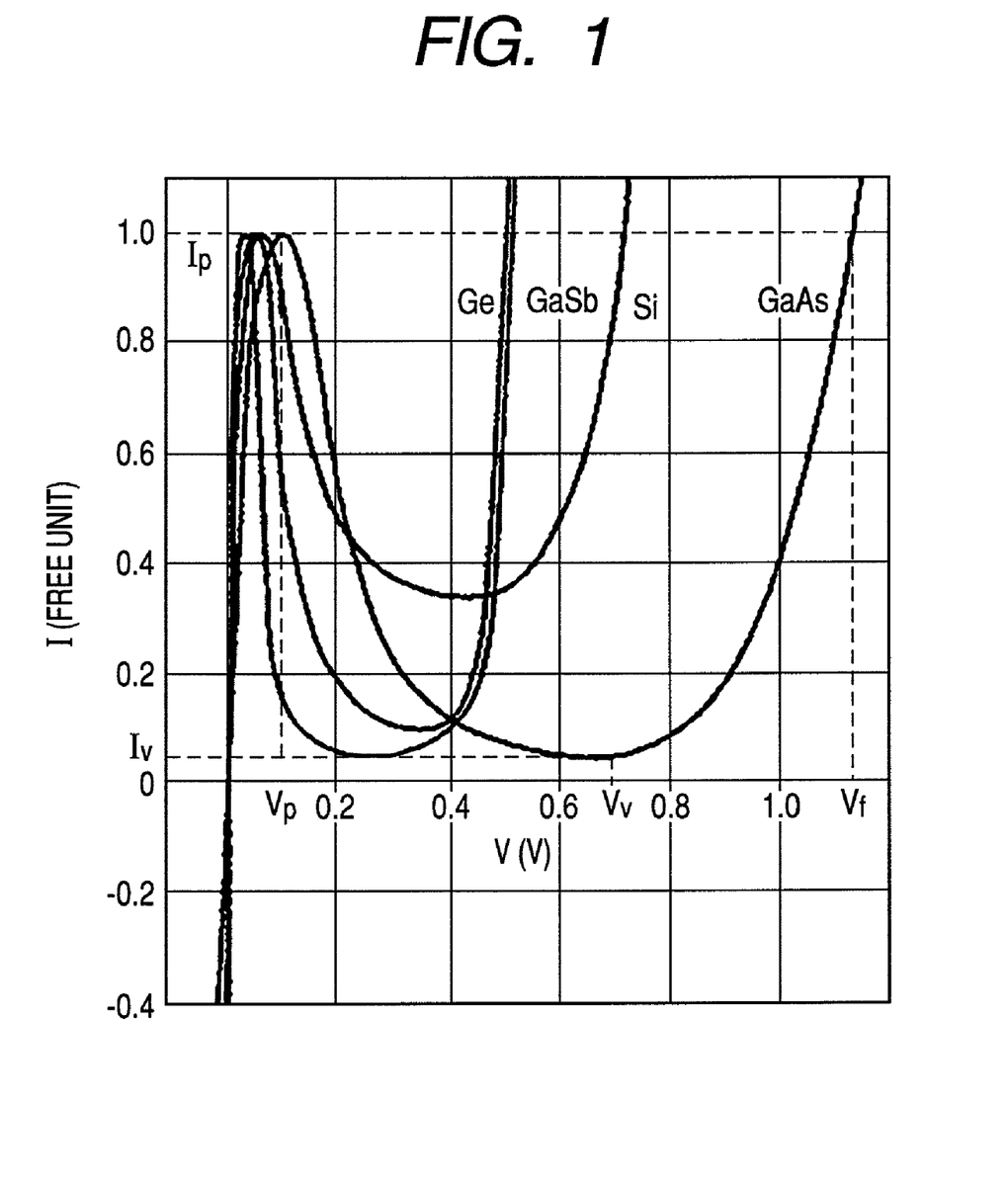
FIG. 1 shows current/voltage characteristics of an Esaki diode which has been prepared from various materials.
Figure 2:
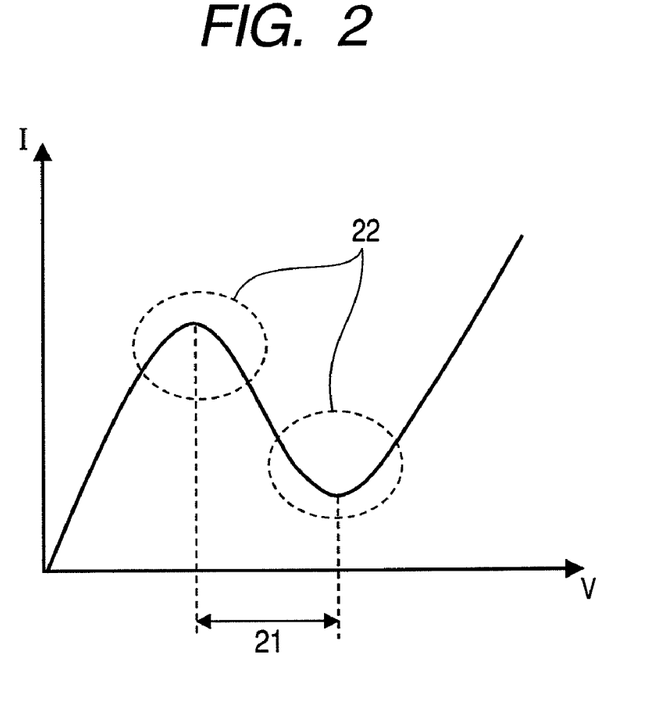
FIG. 2 illustrates current/voltage characteristics of an Esaki diode.

FIG. 1 illustrates current/voltage characteristics of an Esaki diode which has been prepared from various materials (Ge, GaSb, Si and GaAs). FIG. 2 schematically illustrates these characteristics. Reference numeral 21 in FIG. 2 denotes a negative-resistance region which exists in current/voltage characteristics. Such a device as exhibiting a negative resistance which is specific electrical conduction characteristics can be applied to an oscillator, an amplifier, a mixer, a switching device, and the like.

It is also proposed to use a magneto-resistive effect device as a magnetic memory device, which has a ferromagnetic tunnel junction having a first ferromagnetic layer, an insulation layer and a second ferromagnetic layer stacked therein (for instance, in Patent Document 2). The magneto-resistive effect device also has current/voltage characteristics including a negative-resistance region.

Patent Document 1: Japanese Patent Publication No. S35-006326
Patent Document 2: Japanese Patent Application Laid-Open No. 2004-158750

Current/voltage characteristics of an Esaki diode is expressed by the sum of electric current components having three different components of a tunnel current, an excessive current and a diffusion current. Therefore, the current/voltage characteristics show not only an excellent linear region but also a non-linear region over a wide range as is illustrated in a region 22 in FIG. 1. Such existence of a non-linear region causes a problem that when the diode is applied to an amplifying apparatus, the amplifying apparatus cannot obtain a stable gain.

In addition, in the Esaki diode, a voltage region showing negative resistance is determined by a band gap of a material. Accordingly, the voltage region developing the negative resistance is determined by the material, so that a negative-resistance device having a different voltage region cannot be prepared by the same materials.

A magneto-resistive effect device having a ferromagnetic tunnel junction disclosed in Patent Document 2 also shows the negative resistance, but the current/voltage characteristics include a large non-linear region similar to the Esaki diode.

SUMMARY OF THE INVENTION

The present invention has been designed so as to solve the above problem, and is directed to provide a two-terminal type negative-resistance device which causes the negative resistance by mechanism different from the Esaki diode using tunneling through broken bandgap, and to realize a device having a excellent linearity in negative-resistance region. The present invention is also directed to provide devices which have various current/voltage characteristics from given materials, and to realize the negative-resistance device which can be flexibly applied to various electronics fields.

In a magneto-resistive device including a magnetic free layer, an intermediate layer and a magnetic pinned layer, a negative resistance in the current/voltage characteristics of the magneto-resistive device is generated, by modulating the magnetization reversal of the magnetic free layer due to spin-torque with an effective magnetic field and a voltage control by flowing an electric current to a magnetic free layer side from a magnetic pinned layer side, when an angle in magnetization directions between the magnetic free layer and the magnetic pinned layer is acute or small (preferably parallel) and thereby continuously causing the magnetization reversal.

The negative-resistance device according to the present invention comprises: a magneto-resistive device; including a magnetic free layer, a magnetic pinned layer having a magnetic moment larger than that of the magnetic free layer, and an intermediate layer provided between the magnetic free layer and the magnetic pinned layer, a first electrode layer provided in a magnetic free layer side of the magneto-resistive device; and a second electrode layer provided in a magnetic pinned layer side of the magneto-resistive device, wherein negative resistance is exhibited by continuous change of a magnetization direction of the magnetic free layer.

In addition, the only stable state is that the magnetization direction of the magnetic free layer and the magnetization direction of the magnetic pinned layer form an acute angle or are parallel when voltage is not applied to the magneto-resistive device, and negative resistance is exhibited by applying the voltage so as to make electrons flow into the magnetic free layer from the first electrode layer to induce the continuous change of the magnetization direction of the magnetic free layer.

For this purpose, the negative-resistance device according to the present invention may be configured to has means for applying a magnetic field to the magneto-resistive device so that the angle formed by the magnetization direction of the magnetic free layer and the magnetization direction of the magnetic pinned layer is stably acute when the voltage is not applied to the magneto-resistive device.

Furthermore, the negative-resistance device may be configured so that the means for applying the magnetic field is formed of a permanent magnetic layer, and the negative-resistance device further comprises an insulation layer to avoid electrical short between the permanent magnetic layer and the magneto-resistive device, the first electrode layer and the second electrode layer.

As another aspect, the negative-resistance device can also be configured so as not to have means for applying the magnetic field. In this case, the negative-resistance device is configured so that the intermediate layer has such a thickness that induces an acute angle between the magnetization direction of the magnetic free layer and the magnetization direction of the magnetic pinned layer as an allowable single stable state.

In addition, a magnetoresistance ratio of the magneto-resistive device is preferably 100% or more.

Furthermore, the negative-resistance device may fix the magnetization direction of the magnetic pinned layer by forming an anti-ferromagnetic layer adjacent to the magnetic pinned layer, and forming a stacked structure of an anti-ferromagnetic layer, a ferromagnetic layer and a non-magnetic layer.

In the present invention, a negative resistance is developed based on a mechanism that the negative resistance is generated based on a change of balance state in magnetization by moderating a bias voltage, and consequently, the present invention can provide a negative-resistance device having a negative-resistance region with superior linearity to that of a conventional negative-resistance device. The present invention is also directed for devices to have various current/voltage characteristics to be prepared by using the same materials, and to realize the negative-resistance device which can be flexibly applied to various electronics fields.

DESCRIPTION OF REFERENCE NUMERALS 21 negative-resistance region
22 non-linear region
30 magneto-resistive device
31 magnetic pinned layer
32 intermediate layer
33 magnetic free layer
34 magnetization directions of magnetic pinned layer and magnetic free layer
40 spin valve type of magneto-resistive device
41 anti-ferromagnetic layer
42 first magnetic pinned layer
43 non-magnetic layer
44 second magnetic pinned layer
45 non-magnetic layer (intermediate layer)
46 magnetic free layer
47 synthetic-anti-ferrocoupling
51 hysteresis region
80 negative-resistance device
81 magnetic pinned layer
82 intermediate layer
83 magnetic free layer
84, 85 electrode layer
86, 86a, 86b insulation layer
87, 87a, 87b permanent magnetic layer
88 direction of magnetic moment of magnetic pinned layer
89 magneto-resistive device
90 negative-resistance device
98 direction of magnetic moment of magnetic pinned layer
101 hysteresis region

DETAILED DESCRIPTION OF EMBODIMENTS

In the present invention, an electronic spin injection in a magneto-resistive device causes a continuous change in a magnetization direction of the magnetic free layer. By doing this, a negative-resistance region appears in the current/voltage characteristics, and a negative-resistance device using a magneto-resistive effect is realized.

Among various characteristics of the negative resistance realized by the present invention, the value of characteristic voltage (voltage of starting negative resistance) is determined by a critical current value which causes a spin injection magnetization reversal, and a current ratio (peak-to-valley ratio in current/voltage characteristics) is determined by a magnetoresistance ratio shown by the magneto-resistive device. The magnetization direction of the magnetic free layer is determined by a balance status between a torque given to the magnetic moment by an electrical bias (namely, a force of rotating the magnetic moment to a reversal direction, and a force of retaining the magnetic moment. The negative-resistance region realized by the present invention is due to in the continuous change of such balance status, and accordingly exhibits better linearity than that in a conventional negative-resistance device.

Figure 3:
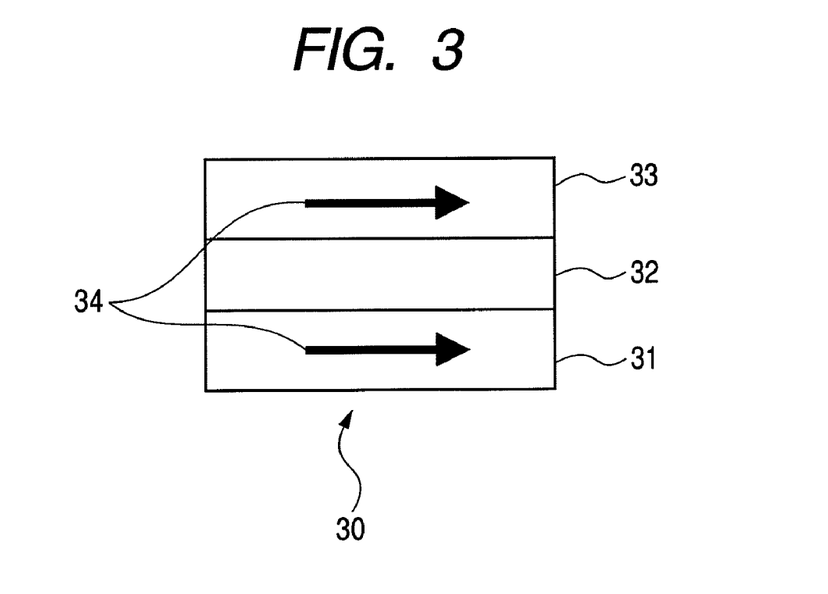
FIG. 3 shows a configuration of a magneto-resistive device which is used as a negative-resistance device according to the present invention.

At first, a configuration of a magneto-resistive device used as a negative-resistance device according to the present invention will now be described with reference to FIG. 3. A magneto-resistive device 30 includes a magnetic pinned layer 31, an intermediate layer 32 and a magnetic free layer 33, and has a structure in which the intermediate layer 32 is arranged between the magnetic pinned layer 31 and the magnetic free layer 33. In FIG. 3, magnetization directions of the magnetic pinned layer 31 and the magnetic free layer 33 are depicted by arrows 34. The terms of "magnetic free layer" and "magnetic pinned layer" are used in the present specification hereafter in a definition that the magnetic moment of the magnetic free layer is smaller than that of the magnetic pinned layer.

The magneto-resistive device 30 functions as a negative-resistance device when a voltage to be applied to the magneto-resistive device is appropriately controlled. As an example, when the magnetic moment of the magnetic free layer 33 is parallel to that of the magnetic pinned layer 31 as is shown by the arrow 34 in FIG. 3, a voltage is applied to the magneto-resistive device 30 so as to make an electric current flow toward the magnetic free layer 33 from a magnetic pinned layer 31 side in order to make electrons flow into the magnetic pinned layer 31 from a magnetic free layer 33 side.

Furthermore, voltage is controlled so that the voltage applied to the magneto-resistive device 30 can be gradually increased. How the magneto-resistive device 30 reacts with controlled bias voltage will now be described below.

(1) When the applied voltage increases, the value of an electric current flowing through the magneto-resistive device 30 also increases.
(2) When the current value increases, a spin torque applied to the magnetic moment of the magnetic free layer 33 increases.
(3) When a current value flowing through the magneto-resistive element reaches a critical current value at which the magnetization of magnetic free layer 33 is reversed (Hereinafter, the critical current value is referred to as $I_1$, and a voltage value applied to a device 30 is referred to as $V_1$), the spin torque applied to the magnetic moment of the magnetic free layer 33 reaches a sufficient value (hereinafter referred to as $f_1$), and the magnetic moment attempts to cause the magnetization reversal.
(4) When the magnetic moment of the magnetic free layer 33 is to be reversed, the magnetic moment of the magnetic free layer 33 and the magnetic moment of the magnetic pinned layer 31 deviate from a parallel state to each other. Then, the resistance value of the magneto-resistive device 30 increases due to the magneto-resistive effect.
(5) As the resistance value increases, the current value flowing through the magneto-resistive device 30 decreases. When the current value flowing through the device 30 is represented by $V_2$, and the voltage value to be applied is represented by $V_2$, the relationships satisfy $I_2<I_1$ and $V_1<V_2$, as long as the magnetic resistance ratio (MR ratio) of the magneto-resistive device 30 is a large value to some extent, which will be described later. In other words, the gradient of current/voltage characteristics of the device 30 becomes negative, and a negative resistance is generated.
(6) As the current value flowing through the device 30 decreases, the quantity of electrons for causing a spin torque applied to the magnetic moment of the magnetic free layer 33 also decreases. Thereby, the spin torque is weakened, and when the spin torque at this time is represented by $f_2$, the relationship satisfies $f_2<f_1$.
(7) Because the spin torque is weakened, the magnetic moment of the magnetic free layer 33 which is going to be inverted stops at such a position as to balance with an effective magnetic field.
(8) The voltage applied to the device 30 is controlled so as to gradually increase, so that the action returns to (1) again, and the actions of (1) to (7) are repeated. Every time the actions of (1) to (7) are repeated, the magnetic moment of the magnetic free layer 33 gradually moves to a state of being anti-parallel to the magnetic moment of the magnetic pinned layer 31.

As is described above, a negative-resistance device according to the present invention causes a state in which the magnetization reversal of the magnetic free layer 33 continuously occurs (in other words, a state in which the direction of the magnetic moment of the magnetic free layer 33 against the direction of the magnetic moment of the magnetic pinned layer 31 is continuously changed to an anti-parallel state), by controlling the applied voltage so as to continually increase in the magneto-resistive device 30. As the control voltage continually increases, the resistance value of the device 30 also continually increases, so that the value of differential resistance becomes negative and a negative resistance can be realized.

However, in order to cause the magnetization reversal through a spin injection magnetization reversal in this way, the magnetic moment of the magnetic free layer 33 (ferromagnetic layer) causing the magnetization reversal needs to be smaller than the magnetic moment of the magnetic pinned layer 31, as is defined in the above description in the present specification.

Furthermore, the present inventors have found an important condition for realizing a negative-resistance device with the use of a magneto-resistive device 30. An experiment in which the condition has been found will now be described below.

Figure 4:
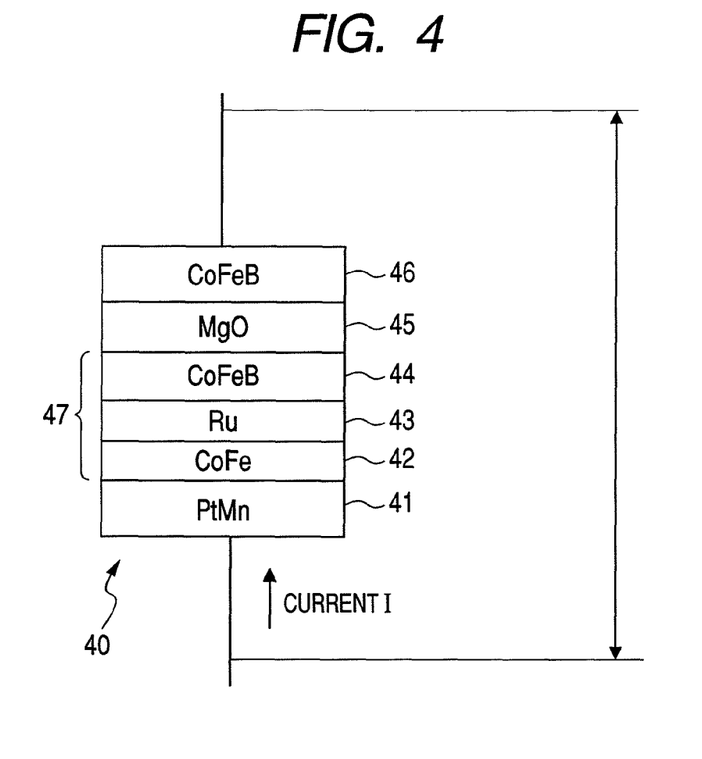
FIG. 4 illustrates a configuration of a spin-valve-type magneto-resistive device which employs a synthetic-anti-ferrocoupling to a magnetic pinned layer.

FIG. 4 illustrates a spin-valve-type magneto-resistive device 40 in which synthetic-anti-ferromagnetic coupling is provided in a magnetic pinned layer, as a magneto-resistive device which can be used in the present invention. The magneto-resistive device 40 has a structure in which an anti-ferromagnetic layer 41 formed from platinum manganese (PtMn), a first magnetic pinned layer 42 that is a ferromagnetic layer formed from iron cobalt (CoFe), a non-magnetic layer 43 formed from ruthenium (Ru), a second magnetic pinned layer 44 that is the ferromagnetic layer formed from iron cobalt boron ternary alloy (CoFeB), a non-magnetic layer (intermediate layer) 45 formed from magnesium oxide (MgO) and a magnetic free layer 46 formed from CoFeB are stacked. The second magnetic pinned layer 44, the intermediate layer 45 and the magnetic free layer 46 correspond to the magnetic pinned layer 31, the intermediate layer 32 and the magnetic free layer 33 in FIG. 3, respectively. The first magnetic pinned layer 42, the non-magnetic layer 43 and the second magnetic pinned layer 44 form the synthetic-antiferromagnetic coupling layer. The magnetization direction of the second magnetic pinned layer 44 is fixed by forming the anti-ferromagnetic layer 41, the first magnetic pinned layer 42 and the non-magnetic layer 43 adjacent to the second magnetic pinned layer 44. Only an anti-ferromagnetic layer 41 is formed adjacent to the second magnetic pinned layer 44, as another configuration.

Hereafter, in the present exemplary embodiment, a magneto-resistive device 40 was set at the square shape of approximately 100 nm in longitudinal and transverse directions in a film plane (direction parallel to film surface). In addition, as for the thicknesses of each layer, an anti-ferromagnetic layer 41 was set at 15 nm, a first magnetic pinned layer 42 at 3 nm, a non-magnetic layer 43 at 0.85 nm, a second magnetic pinned layer 44 at 3 nm, an intermediate layer 45 at 1.1 nm, and a magnetic free layer 46 at 2 nm. The magnetic free layer 46 is formed so as to have a magnetic moment smaller than the second magnetic pinned layer 44, by making the magnetic free layer 46 thinner than the second magnetic pinned layer 44.

Figure 5:
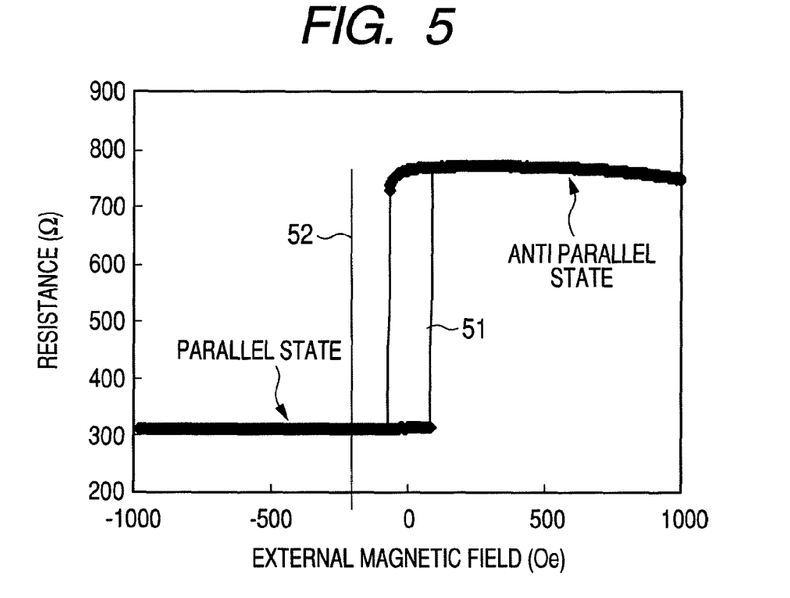
FIG. 5 illustrates characteristics of change of resistance with respect to external magnetic field of a spin-valve-type-magneto-resistive device.

FIG. 5 shows characteristics of change of resistance—with respect to external magnetic field (R–H) in the spin valve type magneto-resistive device 40. When an external magnetic field 51 less than reversal field is applied to the magneto-resistive device 40 (for instance, when external magnetic field is zero), the magnetic free layer 46 and the magnetic pinned layer 47 can be parallel (low resistance value) to each other or anti-parallel (high resistance value) to each other as a stable point. Hereafter, in the present exemplary embodiment, current/voltage characteristics of the magneto-resistive device 40 shall be measured in a state in which the magnetization direction of the magnetic free layer 46 and the magnetization direction of the magnetic pinned layer 47 are parallel.

Figure 6:
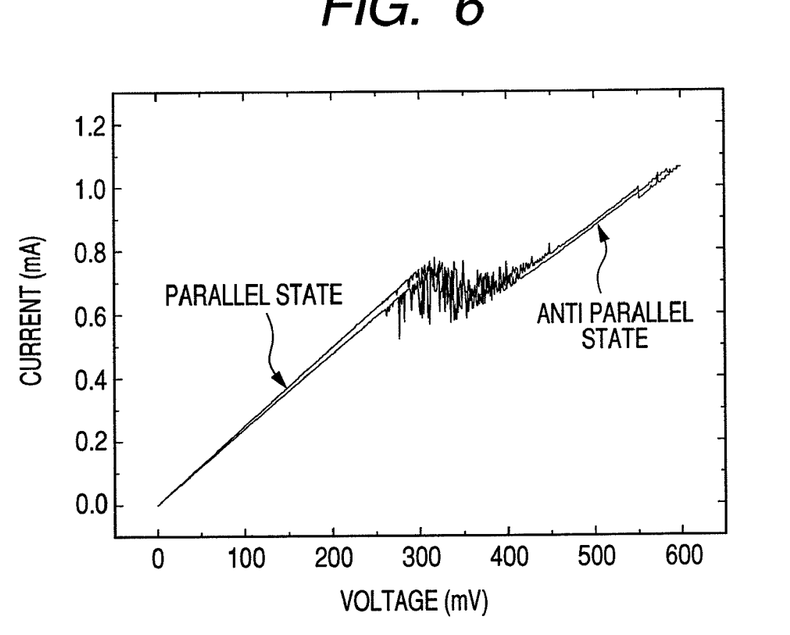
FIG. 6 shows current/voltage characteristics, which is measured with external magnetic field applied to a magneto-resistive device so that the magneto-resistive device in FIG. 4 can be stable in a parallel state, and then the external magnetic field is not applied.

First of all, the external magnetic field is applied to the magneto-resistive device so that the magnetization directions become stable in a parallel state, then the external magnetic field is removed, and the current/voltage characteristics is measured in the state (the external magnetic field is zero). The measurement result is shown in FIG. 6. When the current value flowing through the magneto-resistive device 40 reaches the critical current value of the magnetic free layer 46, and starts the magnetization reversal in the magnetic free layer 46, the resistance value of the magneto-resistive device 40 changes at random and does not show a clear tendency of negative resistance, as is shown in FIG. 6. This is considered to be because both of the parallel state and the anti-parallel state can be stable in an effective magnetic field of the present experimental condition as is illustrated in FIG. 5, the magnetization direction of the magnetic free layer jumps from the parallel state to the anti-parallel state or the anti-parallel state to the parallel state by Joule heating caused by the bias application, and accordingly does not cause the continuous magnetization reversal.

It was found from this experiment that when the value of the effective magnetic field applied to the magneto-resistive device is in the inside of the hysteresis region (for instance, 51 in FIG. 5) of the R–H characteristics, in other words, when the magnetization direction of the magnetic free layer and the magnetization direction of the magnetic pinned layer can be stable both in a state of being parallel to each other and a state of being anti-parallel to each other, an adequate negative resistance cannot be realized by controlling the applied voltage.

Figure 7:
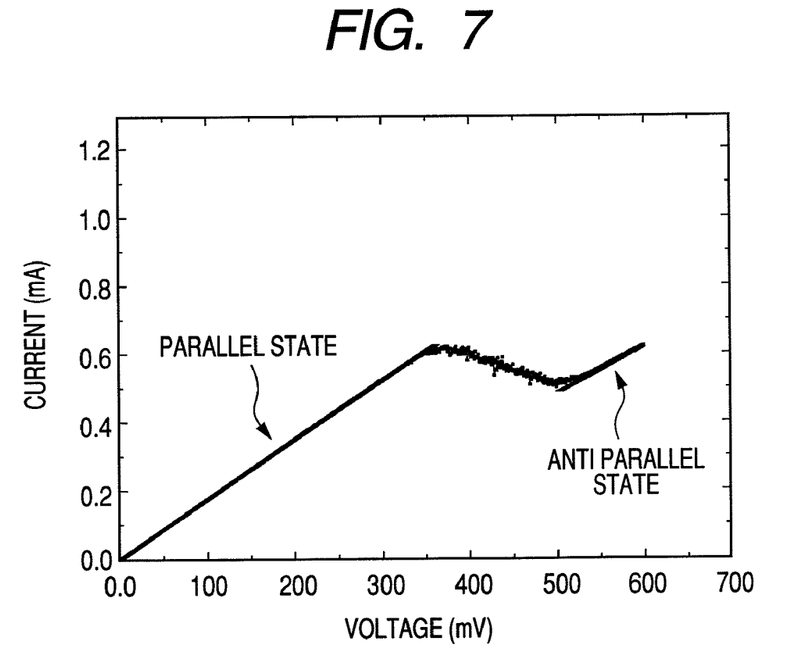
FIG. 7 shows current/voltage characteristics measured after such an external magnetic field having been applied to a magneto-resistive device in FIG. 4 that the magneto-resistive device can be stable only at a parallel state.

Subsequently, the external magnetic field to be applied to the magneto-resistive device 40 in FIG. 4 is set at the point of 52 as illustrated in FIG. 5, and the current/voltage characteristics is measured in a state in which the magnetization directions are stable only in a parallel state. The measurement result is shown in FIG. 7. Thus, a continuous change of the magnetization direction to the anti-parallel state from the parallel state in the magnetic free layer can be obtained by controlling the applied voltage so as to gradually increase, and further controlling the magnetization reversal due to the external magnetic field, and the negative resistance can be thereby realized. The negative-resistance region in FIG. 7 shows adequate linearity, and a problem of non-linearity is improved in comparison with a conventional negative-resistance device. Thus, the negative-resistance device using a magneto-resistive effect according to the present invention can show a stable negative resistance by setting an appropriate applied magnetic field, and can provide a stable gain when being applied to an amplifier.

Embodiment 1

As is described above, in order to obtain a stable negative resistance in the present invention, it is necessary to provide the magnetization direction of the magnetic free layer of a magneto-resistive device which is used in a negative-resistance device so as to be stable only in a state of being parallel to the magnetization direction of a magnetic pinned layer.

Figure 8:
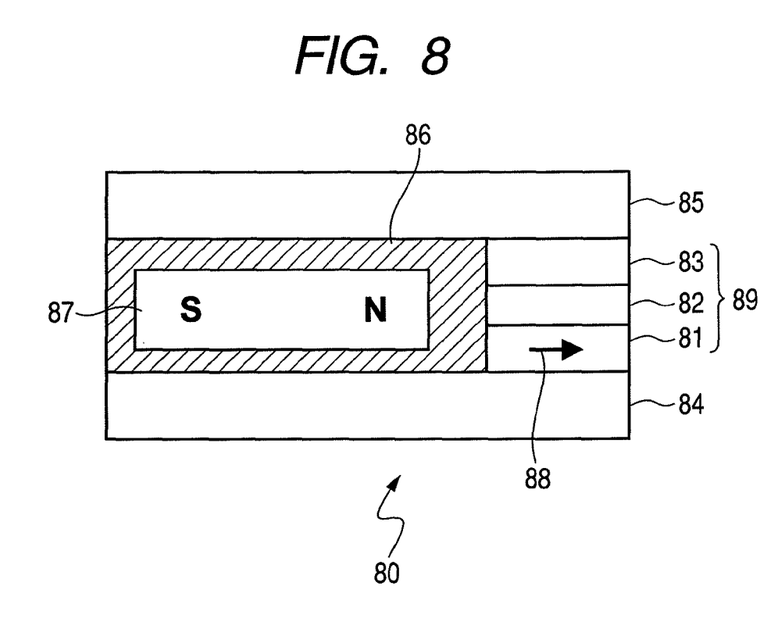
FIG. 8 illustrates one example of a configuration of a negative-resistance device according to the present invention employing means for applying a magnetic field.

An example of the negative-resistance device satisfying such a condition is illustrated in FIG. 8. A negative-resistance device 80 in FIG. 8 includes a magneto-resistive device 89 including a magnetic pinned layer 81, an intermediate layer 82 and a magnetic free layer 83, and electrode layers 84 and 85 for applying voltage to the magneto-resistive device 89. The electrode layers 84 and 85 are formed from a metal such as copper and gold having high electric conductivity. The negative-resistance device 80 is further provided with means for applying the external magnetic field to the magneto-resistive device 89 in the vicinity of the magneto-resistive device 89. The means includes, for instance, a permanent magnetic layer 87 provided on one side of the magneto-resistive device 89, and an insulation layer 86 provided in between the permanent magnetic layer 87 and each of the electrode layers 84 and 85 and the magneto-resistive device 89 so that the electrode layers do not form a short circuit.

In FIG. 8, a direction of the magnetic moment of the magnetic pinned layer 82 is set at a right hand direction as is shown by an arrow 88. As is described above, the magnetization direction of the magnetic free layer 83 needs to be stable only in a state of being parallel to the magnetization direction of the magnetic pinned layer 81 as a stable point, so that a side near to the magneto-resistive device 89 of the permanent magnetic layer 87 is set at an N pole, and a far side thereof is set at an S pole in FIG. 8. By being arranged in such a configuration, the means can apply the external magnetic field to the magnetic free layer so that the magnetic moment of the magnetic free layer can direct in the same direction as the magnetic moment of the magnetic pinned layer 81 (direction of arrow 88), and can apply the external magnetic field so that the magnetic moment of the magnetic free layer 83 is in a state of being parallel to the magnetic moment of the magnetic pinned layer 81. The device 80 functions as a negative-resistance device by applying voltage to the magneto-resistive device 89 so that an electric current can flow into the magnetic free layer from a magnetic pinned layer 81 side through the electrode layers 84 and 85, and controlling the applied voltage so that the applied voltage increases.

Figure 9:
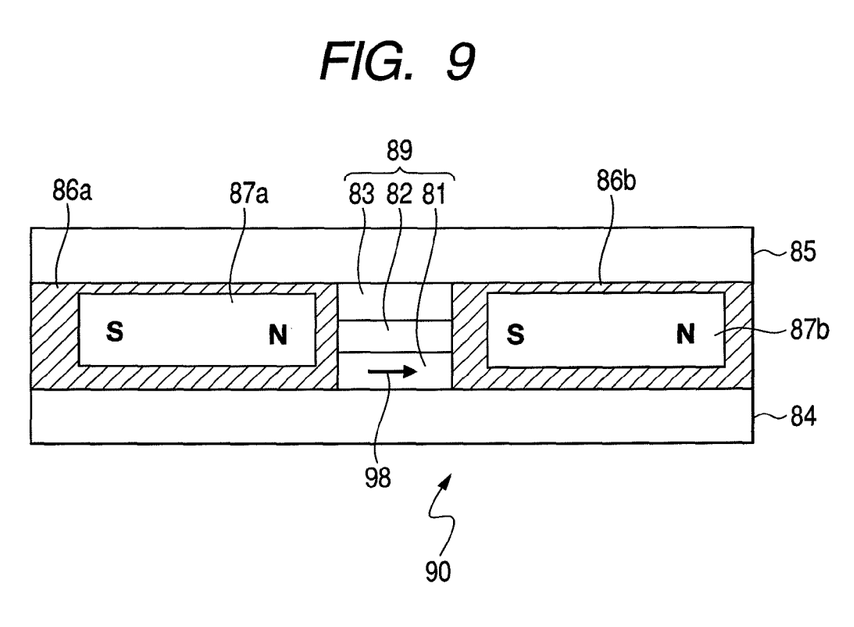
FIG. 9 illustrates one example of a configuration of a negative-resistance device according to the present invention employing means for applying a magnetic field.

A negative-resistance device according to the present exemplary embodiment can function even when a permanent magnetic layer 87 is arranged only in one side of a magneto-resistive device 89, but the permanent magnetic layer can be arranged in both sides of the magneto-resistive device 89. The negative-resistance device having such a configuration is illustrated in FIG. 9. The negative-resistance device 90 in FIG. 9 includes the magneto-resistive device 89, electrode layers 84 and 85 all in FIG. 8, permanent magnetic layers 87a and 87b arranged in both sides of the magneto-resistive device 89, and insulation layers 86a and 86b. An arrow 98 shows the direction of the magnetic moment of a magnetic pinned layer 81. The configuration in FIG. 9 can apply a magnetic field having more uniform magnetic flux to the magneto-resistive device 89 than that in FIG. 8.

The negative-resistance device according to the present exemplary embodiment described in the above was configured so that the magnetization direction of a magnetic free layer of a magneto-resistive device could be parallel (i.e., angle=0°) to the magnetization direction of a magnetic pinned layer, in a state in which voltage was not applied to the magneto-resistive device. However, the negative-resistance device according to the present exemplary embodiment is not limited to such a configuration, as long as an angle formed by the above described two magnetization directions is an acute angle. Thereby, a spin torque is applied to the magnetic moment of the magnetic free layer, and the negative resistance can be realized.

Embodiment 2

In the above described Embodiment 1, the negative-resistance device is configured so as to cause continuous magnetization reversal by realizing a stable condition in the device only when the magnetization directions of the magnetic free layer and the magnetic pinned layer are parallel through applying the external magnetic field to the magneto-resistive device, and by controlling or modulating the magnetization reversal of the magnetic free layer. However, the magnetization reversal can be also controlled by using a shift of the hysteresis region in characteristics of change of resistance with respect to external magnetic field instead of applying the external magnetic field.

Figure 10:
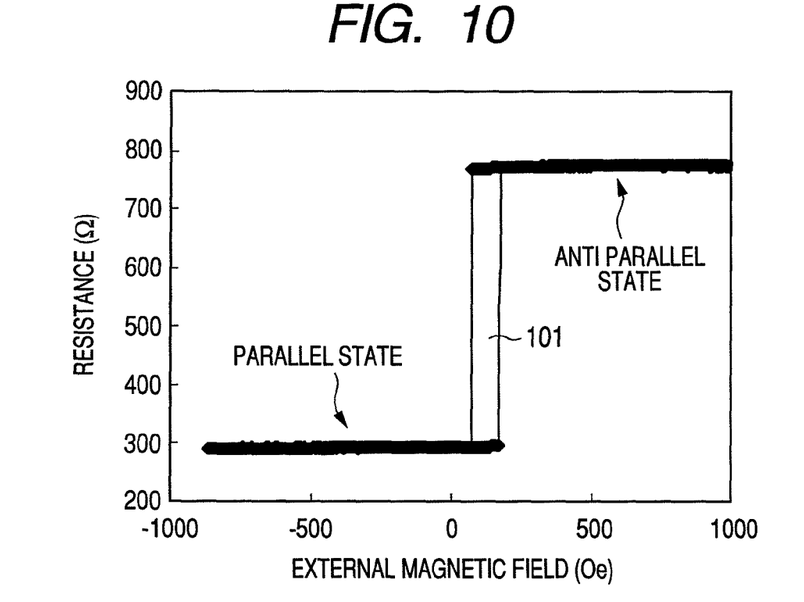
FIG. 10 shows characteristics of change of resistance with respect to external magnetic field measured when a film thickness of an intermediate layer is thinner than that in FIG. 5.

The example will now be described with reference to the spin valve type of a magneto-resistive device 40 illustrated in FIG. 4. A hysteresis region 51 illustrated in FIG. 5 is shifted to right and left on the graph by changing the film thickness of an intermediate layer 45 of a magneto-resistive device 40 (making the layer thick or thin). Characteristics of change of resistance with respect to—external magnetic field (R–H) shown when the intermediate layer 45 is thinned into approximately 1.02 nm which is thinner than that in FIG. 5 are illustrated in FIG. 10. It is understood that a hysteresis region 101 shifts to a direction of preferring a parallel state more (right direction of graph).

The reason of causing such a shift is because a Neel coupling makes a magnetic free layer 46 and a magnetic pinned layer 47 form ferromagnetic coupling when the intermediate layer 45 is formed of MgO as is illustrated in FIG. 4. Here, the Neel coupling means an interaction occurring between the intermediate layer and the magnetic free layer when the surface of the intermediate layer of the magneto-resistive device has unevenness (in other words, roughness) and the like thereon.

In addition, when the intermediate layer is made from a metal such as copper, for instance, it is also possible to make an interlayer coupling due to an RKKY interaction cause an anti-ferromagnetic coupling between the magnetic free layer and the magnetic pinned layer, by changing the film thickness of the intermediate layer of the magneto-resistive device. In this case as well, the hysteresis region in the R–H characteristics shifts to right and left. Here, the RKKY interaction means an interaction caused by a free electron of a non-magnetic atom constituting a non-magnetic layer, which mediates a magnetic interaction between local magnetic moments of the ferromagnetic atom constituting the ferromagnetic layer.

In addition, when a size of the magneto-resistive device in a film surface direction (direction parallel to film surface) reaches a size in which the dimension of an edge domain cannot be ignored, the anti-ferromagnetic coupling occurs due to dipole coupling between the magnetic free layer and the magnetic pinned layer.

The shift of the above-described hysteresis is expressed by the sum of these coupled magnetic fields. Therefore, the hysteresis is shifted to such a direction as a parallel state is preferred (right direction in FIG. 5) in a state in which the external magnetic field is not applied (in which the external magnetic field is zero), by intensifying the Neel coupling. In addition, the hysteresis is shifted to such a direction as an anti-parallel state is preferred (left direction in FIG. 5) in a state in which the external magnetic field is not applied, by intensifying the interlayer coupling due to the RKKY interaction or the dipole coupling.

In this way, it is possible to realize a state in which only a parallel state or only an anti-parallel state is stable, without applying the external magnetic field to the magneto-resistive device, by controlling the strength of a coupling force, and the magneto-resistive device becomes possible to be used as a negative-resistance device.

Figure 11:
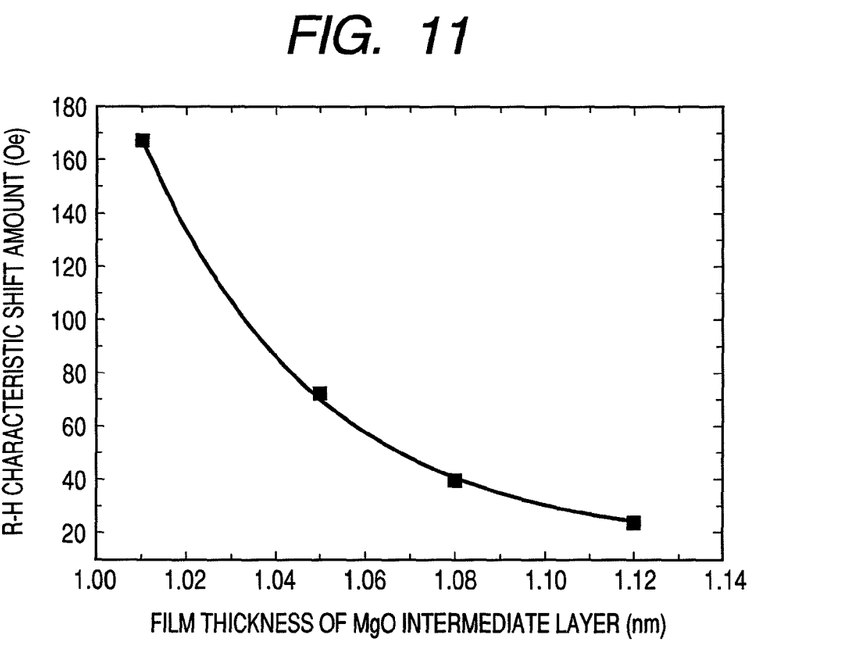
FIG. 11 shows the shift quantity of characteristics of change of resistance with respect to external magnetic field measured when a film thickness of an intermediate layer 45 formed by MgO is varied.

As an example, magneto-resistive devices 40 were prepared by changing the film thickness of the intermediate layer 45 formed from MgO and setting the size of the device in the film plane direction at approximately 100 nm×100 nm. A shifted amount in the R–H characteristics is shown in FIG. 11. In this case, the size of the magneto-resistive device 40 in the plane direction reaches a size in which the dimension of the edge domain cannot be ignored, so that the shifted amount of the magnetic field is determined by the combination of the Neel coupling and the dipole coupling. As can be understood from the result in FIG. 11, the magneto-resistive device can shift the R–H characteristics by changing the film thickness of the intermediate layer.

Figure 12:
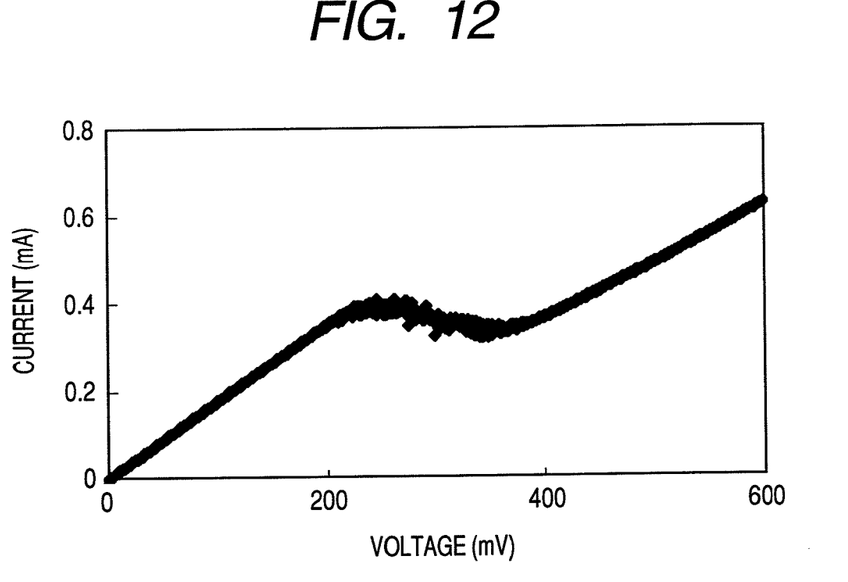
FIG. 12 shows current/voltage characteristics of magneto-resistive device having characteristics of change of resistance with respect to external magnetic field in FIG. 10.

FIG. 12 shows current/voltage characteristics of a magneto-resistive device 40 having R–H characteristics in FIG. 10. An external magnetic field is not applied. As is shown in FIG. 10, the magneto-resistive device can form the state in which only a parallel state is a stable point, by shifting the hysteresis region in the R–H characteristics without applying the external magnetic field. Accordingly, the magnetization reversal is effectively reduced even in a state free from the external magnetic field, and the magnetization reversal continuously occurs, so that a negative-resistance region clearly appears in the current/voltage characteristics, as is shown in FIG. 12. Thus, the magneto-resistive device having the film thickness of the intermediate layer adequately set according to the present invention functions as a negative-resistance device, even without including permanent magnetic layers 87, 87a and 87b as illustrated in FIG. 8 and FIG. 9.

As in Embodiment 1, also in the present exemplary embodiment, a magnetization direction of a magnetic free layer of a magneto-resistive device in a state in which voltage is not applied is not necessarily parallel to a magnetization direction of a magnetic pinned layer, but has only to form an acute angle.

Embodiment 3

When $R_P$ is defined as an electric resistance of a magneto-resistive device in which the magnetization direction of the magnetic free layer is parallel to that of the magnetic pinned layer, and $R_{AP}$ is defined as an electric resistance of a magneto-resistive device in which the magnetization direction is anti-parallel, a magnetoresistance ratio (MR ratio) of the magneto-resistive device is defined as $(R_{AP}-R_P)/R_P$. A peak valley ratio in current/voltage characteristics is determined by the magnitude of the magnetoresistance ratio. Therefore, the peak valley ratio can be increased by using a magneto-resistive device showing a large magnetoresistance ratio, and accordingly the negative-resistance device can be obtained which is suitable for application to an oscillator, an amplifier, a mixer, a switching device and the like. On the other hand, a magneto-resistive device showing a small magnetoresistance ratio may not cause sufficient negative-resistance characteristics, even though the magnetization in the magnetic free layer would continuously change.

Figure 13:
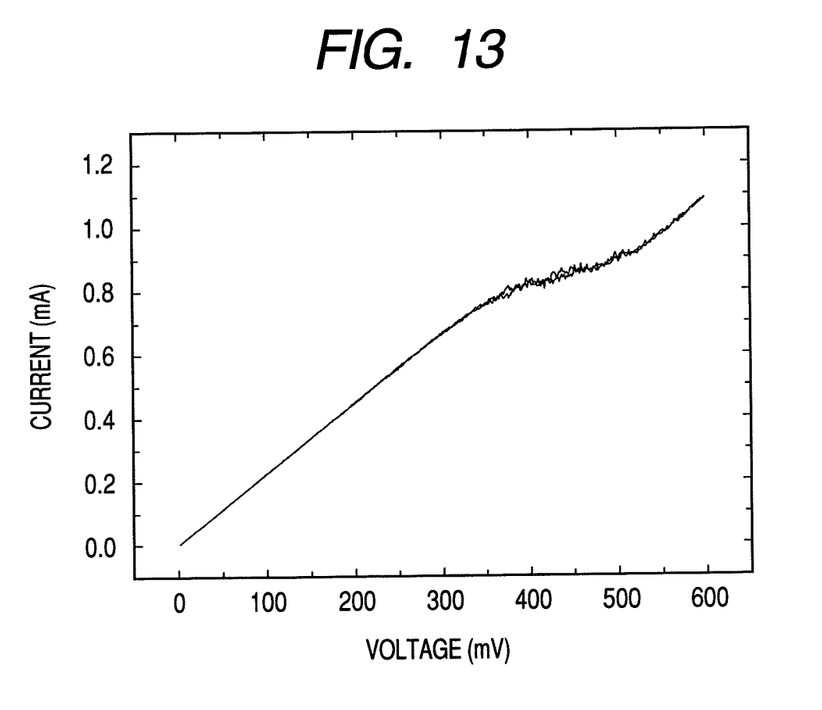
FIG. 13 shows current/voltage characteristics of a magneto-resistive device in FIG. 4, of which the MR ratio is approximately 80%.

FIG. 13 shows current/voltage characteristics measured on a magneto-resistive device 40 in which the MR ratio is set at approximately 80%. At this time, the current/voltage characteristics were measured on the condition of applying an external magnetic field to the device 40 so that only a parallel state can be a stable point similarly to the measurement time in FIG. 7, and gradually increasing the voltage to be applied thereto. In FIG. 13, a random change as shown in FIG. 6 is not seen, but it is understood that the magnetization direction of a magnetic free layer 46 in the magneto-resistive device 40 continuously changes from a parallel state with respect to the magnetization direction of the magnetic pinned layer 47 to an anti-parallel state. However, because the MR ratio is small, the magneto-resistive device does not make differential resistance negative, and does not show negative resistance.

Figure 14:
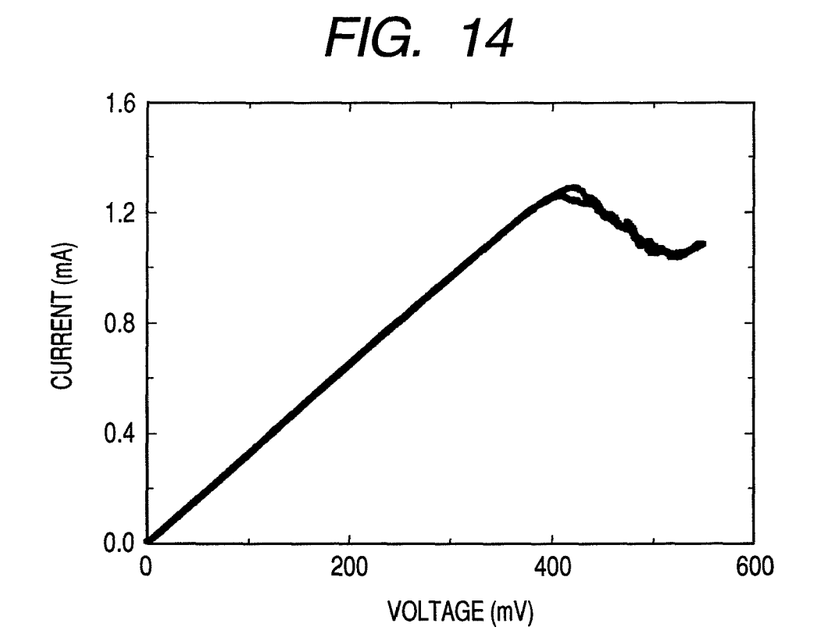
FIG. 14 shows current/voltage characteristics of the magneto-resistive device in FIG. 4, of which the MR ratio is approximately 100%.

FIG. 14 shows current/voltage characteristics measured in the same condition on a magneto-resistive device 40 in which the MR ratio is set at approximately 100%. It is understood that when the MR ratio becomes approximately 100%, the magneto-resistive device 40 clearly shows the negative resistance. Thus, the magneto-resistive device according to the present invention needs a magnetoresistance ratio which is large to some extent, in order to realize a negative-resistance device. The magnetoresistance ratio is preferred to be approximately 100% or more.

A magneto-resistive device which has been described in the present invention has a structure in which an intermediate layer is formed on a magnetic pinned layer and a magnetic free layer is formed thereon. However, these layers have only to be arranged so that the magnetic free layer and the magnetic pinned layer sandwich the intermediate layer, and either of the magnetic free layer or the magnetic pinned layer may be in an upper position. When operating a negative-resistance device using the magneto-resistive device according to the present invention, gradually increasing the voltage to be applied to the magneto-resistive device, and then controlling the applied voltage are performed, as is described above. At this time, it is necessary to apply the voltage in a direction of making an electric current flow from a magnetic pinned layer side (in other words, in a direction of making electrons flow into from a magnetic free layer side).

By the way, it is preferable to set the dimension of the magnetic free layer in a film plane direction (in direction parallel to film plane) (that is to say, dimension of magneto-resistive device in film plane direction) at 200 nm or smaller both in longitudinal and transverse directions. When employing the magnetic free layer having a larger dimension than the above dimension, the magneto-resistive device may not cause the magnetization reversal by spin injection.

Figure 15:
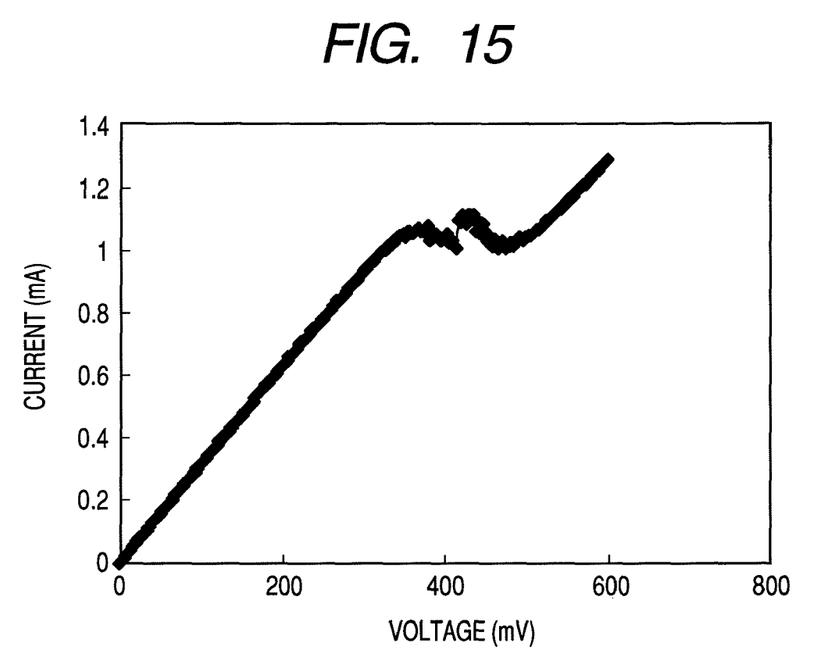
FIG. 15 shows current/voltage characteristics of a magneto-resistive device in FIG. 4, in a case where the shape of a magnetic free layer is rectangular in a film plane direction, and a ratio of the long side to the short side is 2:1.

FIG. 15 shows current/voltage characteristics of a magneto-resistive device 40 provided with a magnetic free layer having a rectangular shape in a film plane direction, in which a ratio of the long side to the short side is 2:1, for instance. In FIG. 15, unstable negative-resistance characteristics are obtained. Accordingly, in order to obtain stable negative-resistance characteristics, the plane shape of the magneto-resistive device to be used for the negative-resistance device of the present invention is preferably an approximately circular or an approximately square.

Further, in a negative-resistance device using a magneto-resistance effect of the present invention, the voltage region in which negative resistance develops is not determined by a band gap of a material, which is different from the principle of an Esaki diode. The present invention can realize negative-resistance devices having different critical current values at which a magnetic free layer starts the magnetization reversal by using the same materials, but through configuring the negative-resistance device so that the magnitudes of an external magnetic field to be applied to a magneto-resistive device are different from each other, or configuring the negative-resistance device so that the magnitudes of the magnetic moment of the magnetic free layer are different from each other. Accordingly, the present invention can produce negative-resistance devices having different voltage regions in which negative resistance develops from the same materials.

Figure 16:
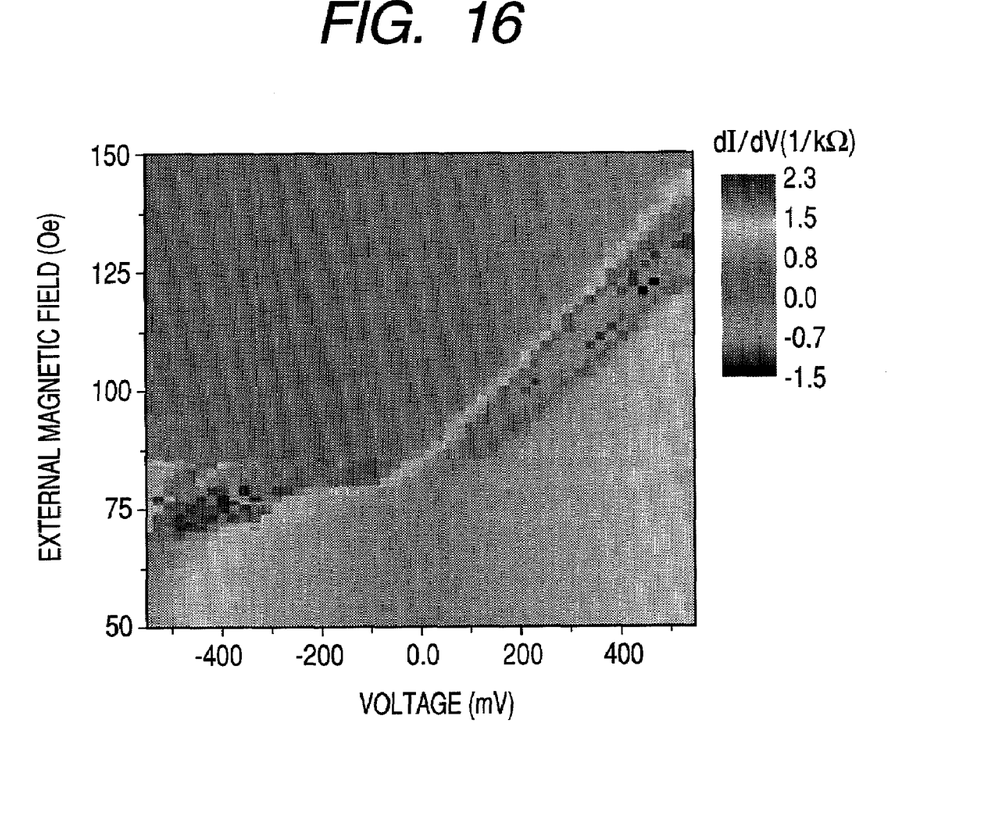
FIG. 16 shows plot of a differential conductance (dI/dV) which has been measured by varying an external magnetic field applied to a magneto-resistive device.

In order to show such an effect of the present invention, current/voltage characteristics were measured by varying an external magnetic field to be applied to the magneto-resistive device 40. FIG. 16 shows plot of a differential conductance (dI/dV) of the current/voltage characteristics as a function of voltage and external magnetic field. As is understood from the measurement result, a voltage region in which negative resistance develops can be varied by varying the external magnetic field.

The invention claimed is:

1. A negative-resistance device including a magneto-resistive element, the magneto-resistive element comprising; a magnetic free layer, a magnetic pinned layer having a magnetic moment larger than that of the magnetic free layer, and an intermediate layer provided between the magnetic free layer and the magnetic pinned layer, a first electrode layer provided in a magnetic free layer side of the magneto-resistive element; a second electrode layer provided in a magnetic pinned layer side of the magneto-resistive element, wherein the magnetic moment of the magnetic free layer is smaller than that of the magnetic pinned layer, and a negative resistance is exhibited when electrons are made to flow into the magnetic free layer from the first electrode layer to cause the continuous change of the magnetization direction of the magnetic free layer, and a means for applying a magnetic field to the negative-resistance element so that a stable condition is established as a single state where the magnetization direction of the magnetic free layer and the magnetization direction of the magnetic pinned layer form an acute angle or are parallel, when a voltage is not applied to the magneto-resistive element.

2. The negative-resistance device according to claim 1, wherein the means for applying the magnetic field is a permanent magnetic layer, and
the negative-resistance device further comprises an insulation layer for insulating the permanent magnetic layer from the magneto-resistive element, the first electrode layer and the second electrode layer.

3. A negative-resistance device including a magneto-resistive element, the magneto-resistive element comprising;
a magnetic free layer,
a magnetic pinned layer having a magnetic moment larger than that of the magnetic free layer,
an intermediate layer provided between the magnetic free layer and the magnetic pinned layer,
a first electrode layer provided in a magnetic free layer side of the magneto-resistive element, and
a second electrode layer provided in a magnetic pinned layer side of the magneto-resistive element,
wherein the intermediate layer has a thickness such that a stable condition is established as a single state where the magnetization direction of the magnetic free layer and the magnetization direction of the magnetic pinned layer stably form an acute angle or are parallel as an allowable single stable state, when a voltage is not supplied to a magneto-resistive element.

4. The negative-resistance device according to claim 1, wherein the magneto-resistive element has a magnetoresistance ratio of 100% or more.

5. The negative-resistance device according to claim 1, further comprising an anti-ferromagnetic layer disposed adjacent to the magnetic pinned layer.

6. The negative-resistance device according to claim 1, further comprising a stacked structure of an anti-ferromagnetic layer, a ferromagnetic layer and a non-magnetic layer disposed adjacent to the magnetic pinned layer.

7. The negative-resistance device according to claim 3, wherein the magneto-resistive element has a magnetoresistance ratio of 100% or more.

8. The negative-resistance device according to claim 3, further comprising an anti-ferromagnetic layer disposed adjacent to the magnetic pinned layer.

9. The negative-resistance device according to claim 3, further comprising a stacked structure of an anti-ferromagnetic layer, a ferromagnetic layer and a non-magnetic layer disposed adjacent to the magnetic pinned layer.

* * * * *